(12) United States Patent
Hirai

(10) Patent No.: US 7,683,410 B2
(45) Date of Patent: Mar. 23, 2010

(54) IMAGE PICKUP DEVICE

(75) Inventor: Isamu Hirai, Tokyo (JP)

(73) Assignee: HOYA Corporation, Tokyo (JP)

( * ) Notice: Subject to any disclaimer, the term of this patent is extended or adjusted under 35 U.S.C. 154(b) by 201 days.

(21) Appl. No.: 11/422,171

(22) Filed: Jun. 5, 2006

(65) Prior Publication Data

US 2006/0278904 A1    Dec. 14, 2006

(30) Foreign Application Priority Data

Jun. 8, 2005    (JP)    ............ P2005-167825

(51) Int. Cl.
*H01L 31/052*    (2006.01)
(52) U.S. Cl. ............ 257/294; 257/432; 257/E31.127
(58) Field of Classification Search ........ 257/294, 257/432, E31.127
See application file for complete search history.

(56) References Cited

U.S. PATENT DOCUMENTS 4,673,269 A * 6/1987 Schiff et al. ............ 355/20

6,171,885 B1 * 1/2001 Fan et al. ............ 438/70

FOREIGN PATENT DOCUMENTS

| JP | 02276378 A | * 11/1990 |
| JP | 2001-332711 | 11/2001 |
| JP | 2003-273338 | 9/2003 |

OTHER PUBLICATIONS

English Language Abstract of JP 2003-273338.
English Language Abstract of JP 2001-332711.

* cited by examiner

*Primary Examiner*—Allen R. Wilson
(74) *Attorney, Agent, or Firm*—Greenblum & Bernstein P.L.C.

(57) ABSTRACT

An image pickup device includes a plurality of photoelectric transducers; and a diffusion-reflection layer provided in front of the plurality of photoelectric transducers, wherein a part of light incident on the diffusion-reflection layer is reflected and dispersed therefrom, and the remainder of the incident light is transmitted through the diffusion-reflection layer so as to be incident on the plurality of photoelectric transducers.

1 Claim, 2 Drawing Sheets

IMAGE PICKUP DEVICE

BACKGROUND OF THE INVENTION

1. Field of the Invention

The present invention relates to an image pickup device suitable for a digital single lens reflex camera.

2. Description of the Related Art

In a known single lens reflex camera, a light emission of a strobe is automatically controlled by a TTL system. In case of a single lens reflex camera using a silver-halide film, diffused light reflected from a photographic emulsion surface of the film is received and detected by TTL light receiving elements. In recent years, digital single lens reflex cameras in which an image pickup device such as CCD is used instead of a photographic film have been widely used. In a known image pickup device used in a digital camera, a micro lens is provided in front of a photoelectric transducer to effectively transmit object light incident through a photographing lens to the photoelectric transducer. To enhance the dynamic range, it has been proposed to provide a light reducing filter made of a material having a reflectance not more than 50% between a part of photoelectric transducers and a color filter (see Japanese Unexamined Patent Publication No. 2003-273338). Moreover, it has also been proposed to coat front and rear surfaces of a ferroelectric film in the form of a micro lens with transparent electrode layers so as to vary the reflectance (Japanese Unexamined Patent Publication No. 2001-332711).

However, since the reflectance at the incident side surface of the image pickup device provided in a digital single lens reflex camera is small, a flash of light emitted from a strobe of a TTL auto strobe system and reflected from an object to be photographed is hardly reflected by the incident surface of the image pickup device and, hence, a small amount of the object light is made incident upon the TTL light receiving elements. Consequently, the output of the TTL light receiving elements is extremely small. As a result, the peak value in the photometering sensitivity distribution of the TTL light receiving elements is deviated from the center, and the photometering sensitivity distribution exhibits a steep curve and the output largely varies in accordance with the movement of the position of an exit pupil of a photographing lens. Also, the Av-response (proportional relationship between the actual aperture opening degree and the output) is not good. In the arrangement disclosed in Japanese Unexamined Patent Publication No. 2003-273338 in which the light reducing film is provided on a part of the photoelectric transducers, the output of the TTL light receiving elements largely varies depending on the position or shape of the object on the image surface, for the same object distance. In the solution disclosed in Japanese Unexamined Patent Publication No. 2001-332711 in which the front and rear surfaces of the micro lens are coated with the transparent electrode layers, a part of light to be made incident upon a photoelectric transducer is incident upon another photoelectric transducer, resulting in a deteriorated image quality.

SUMMARY OF THE INVENTION

The present invention eliminates the drawbacks of the prior art by providing an image pickup device which can improve the TTL auto strobe characteristics in a digital single lens reflex camera.

According to an aspect of the present invention, an image pickup device is provided, including a plurality of photoelectric transducers; and a diffusion-reflection layer provided in front of the plurality of photoelectric transducers, wherein a part of light incident on the diffusion-reflection layer is reflected and dispersed therefrom, and the remainder of the incident light is transmitted through the diffusion-reflection layer so as to be incident on the plurality of photoelectric transducers.

It is desirable for the image pickup device to include color filters provided on the plurality of photoelectric transducers, wherein the diffusion-reflection layer is made of a transparent material provided on surfaces of the color filters.

It is desirable for the plurality of photoelectric transducers to include color filters provided thereon, and for the diffusion-reflection layer to include a microstructure which is finer than each light receiving element of the image pickup device and is provided on surfaces of the color filters so as to diffuse and reflect a part of incident light.

The microstructure can have a diffraction grating structure.

It is desirable for the microstructure to have narrow grooves or projections smaller than the longitudinal or lateral size of the photoelectric transducers.

The microstructure can have a stepped structure which varies in the thickness direction from the central portion of the photoelectric transducers toward the peripheral portion thereof.

The microstructure can have an assembly of condenser lenses having a diameter which is smaller than the longitudinal and lateral sizes of each of the plurality of photoelectric transducers.

It is desirable for the image pickup device to include color filters provided on the plurality of photoelectric transducers, wherein the diffusion-reflection layer includes a microstructure provided on surfaces of the color filters to diffuse and reflect a part of incident light.

The microstructure can have a diffraction grating structure.

It is desirable for the microstructure to have narrow grooves or projections smaller than the longitudinal or lateral size of the photoelectric transducers.

The microstructure can have a stepped structure which varies in the thickness direction from the central portion of the photoelectric transducers toward the peripheral portion thereof.

The microstructure can have an assembly of condenser lenses having a diameter which is smaller than the longitudinal and lateral sizes of each of the plurality of photoelectric transducers.

The present disclosure relates to subject matter contained in Japanese Patent Application No. 2005-167825 (filed on Jun. 8, 2005) which is expressly incorporated herein by reference in its entirety.

BRIEF DESCRIPTION OF THE DRAWINGS

The present invention will be described below in detail with reference to the accompanying drawings in which.

DESCRIPTION OF THE PREFERRED EMBODIMENT

Figure 1:
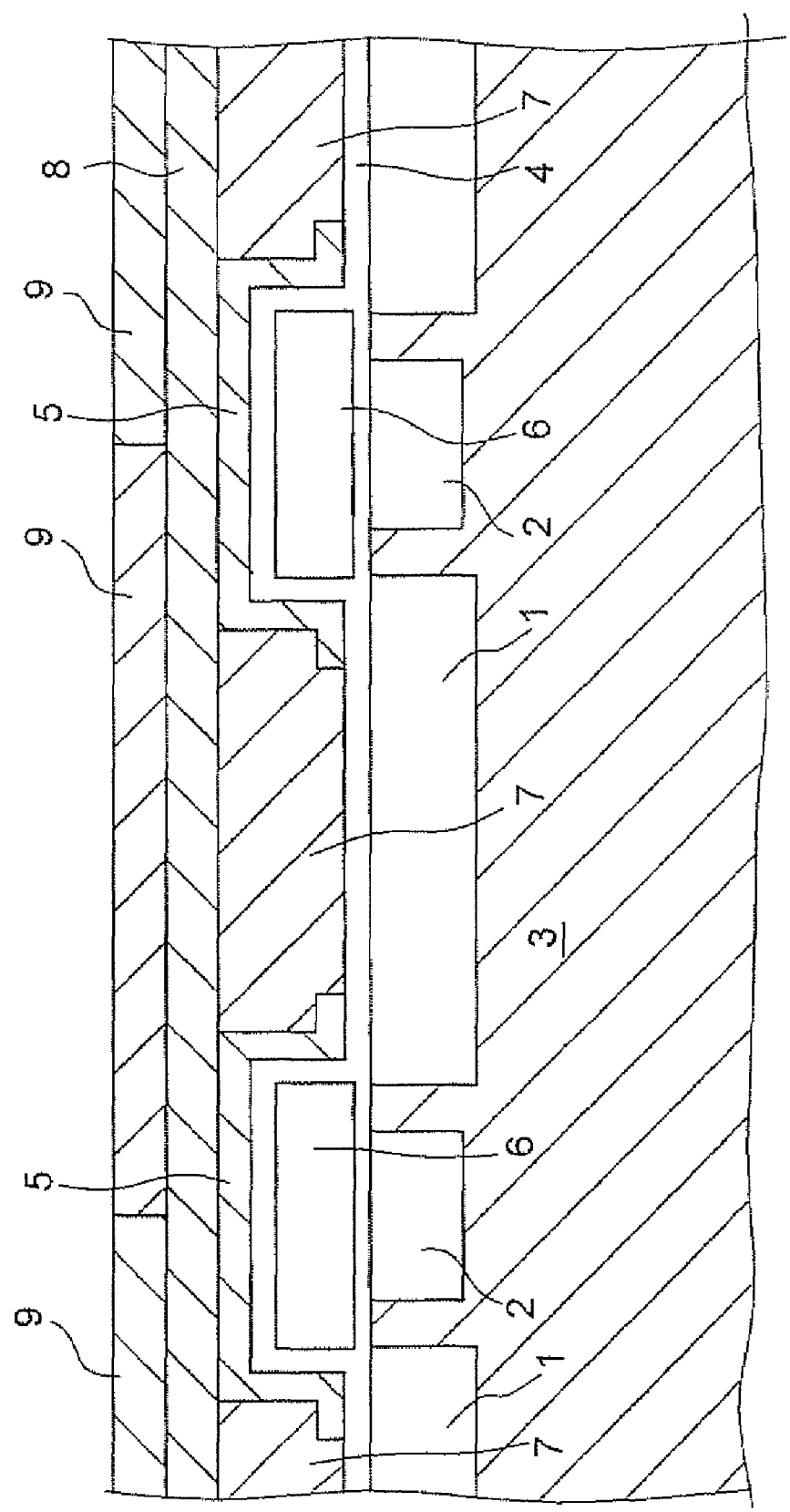
FIG. 1 is a cross sectional view of a CCD image pickup device according to the present invention.

FIG. 1 is a lateral sectional view of a main part of an embodiment of a CCD image pickup device to which the present invention is applied. The CCD solid-state image pickup device includes a large number of photodiodes 1 in a matrix arrangement, serving as photoelectric transducers, and vertical transfer CCD channels 2 extending in the vertical direction between the adjacent photodiodes 1, which are provided in a semiconductor substrate 3. Vertical transfer electrodes 6 are formed on the vertical transfer channels 2 via an insulation film 4, above the semiconductor substrate 3. A diffusion-reflection layer 7 is formed on the photodiodes 1 via the insulation film 4. The vertical transfer electrodes 6 are covered by a light intercepting film 5 so as to prevent the object light from being incident on the vertical transfer electrodes 6. A transparent smoothening film 8 is provided on the entire surface including the diffusion-reflection layer 7 and the light intercepting film S, and color filters 9 are provided on the smoothening film 8. The color filters 9 are filters for the primary colors including red, green and blue, or filters for complementary colors including cyan, magenta, and yellow.

If the image pickup device according to the illustrated embodiment is applied to a digital single lens reflex camera, a part of light incident upon each photodiode 1 is reflected by the diffusion-reflection layer 7, provided on the photodiodes 1, and is emitted from the smoothening film 8 and the color filters 9. The diffusion-reflection layer 7 provided on the surfaces of the photodiodes 1 is surrounded, on its lateral sides, by the light intercepting film 5 and, hence, the reflected light cannot be made incident upon other photodiodes 1.

Additional embodiments of the present invention will be explained with reference to FIGS. 2A through 2E. In a second embodiment shown in FIG. 2A, a diffusion-reflection layer (transparent diffusion material layer) 110, serving as the diffusion-reflection layer, is formed on the color filters 9. It is desirable for the transparent diffusion material to be colorless, such as opal or acrylic light opal, and to be an internal diffusion type. In the second embodiment of the present invention, since a flat layer of the transparent diffusion material is simply formed on the color filters 9, the manufacturing process can be simplified.

If the image pickup device of the second embodiment is applied to a digital single lens reflex camera, since the object light incident upon the image pickup device is partly diffused and reflected by the diffusion-reflection layer 110, not only can the amount of light which can be received by the TTL photometering element be increased, but also the light reflected from a large area can be received by the TTL photometering element.

Figure 2A:
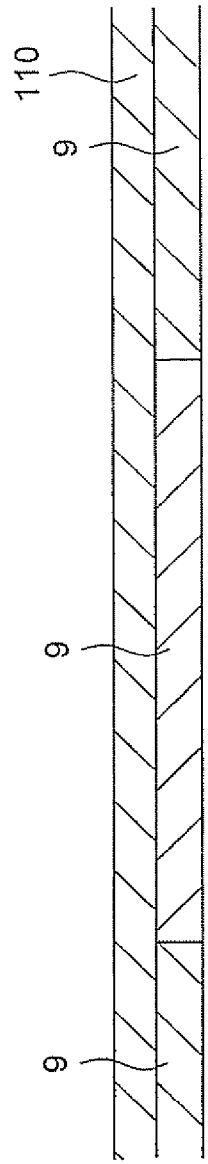
FIG. 2A is a cross sectional view of a CCD image pickup device according to a second embodiment of the present invention.
Figure 2B:
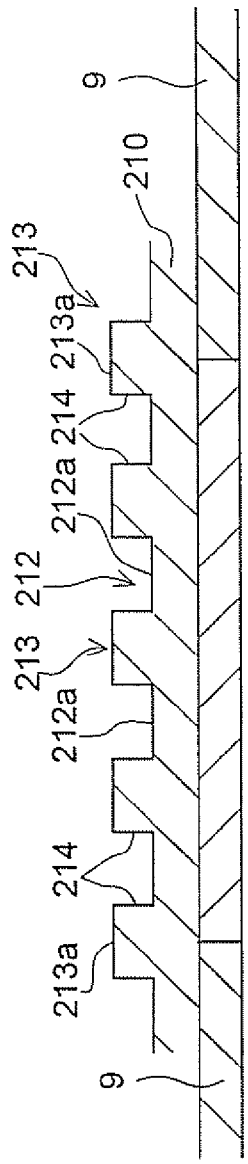
FIG. 2B is a cross sectional view of a CCD image pickup device according to a third embodiment of the present invention.

In a third embodiment of the invention illustrated in FIG. 2B, a diffraction grating structure including grooves 212 and projections 213, both having a rectangular cross section are provided as a diffusion-reflection layer 210. The grooves 212 and the projections 213 have a predetermined width and a predetermined depth (height) and are arranged alternately in the horizontal direction. The width of the rectangular grooves 212 and the rectangular projections 213 is smaller than the sizes of each photodiode 1 in the longitudinal and lateral directions and is approximately ¼ of the width of the photodiode in the illustrated embodiment. The width of the grooves and projections may be smaller. Alternatively, the widths of the rectangular grooves 212 and the rectangular projections 213 can be different from one another. Although the rectangular grooves 212 and the rectangular projections 213 extend in the vertical direction in the illustrated embodiment, they can be replaced with rectangular grooves and projections extending in the horizontal direction. Alternatively, it is also possible to arrange the rectangular grooves 212 extending in the longitudinal and lateral directions.

If the image pickup device according to the third embodiment shown in FIG. 2B is applied to a digital single lens reflex camera, the object light reaching the diffusion-reflection layer 210 is partly reflected by the surfaces 213a of the rectangular projections 213 and is partly reflected by the bottom surfaces 212a of the rectangular grooves 212 and the side surfaces 214, common to the rectangular grooves 212 and the rectangular projections 213, and is emitted from the rectangular grooves 212.

In the third embodiment of the invention, since a part of the object light is reflected substantially at a uniform distribution by the diffusion-reflection layer 210 lying over the entire light receiving surface, the amount of light which can be received by the TTL photometering element is increased and light reflected from a large area can be made incident upon the TTL photometering element.

Figure 2C:
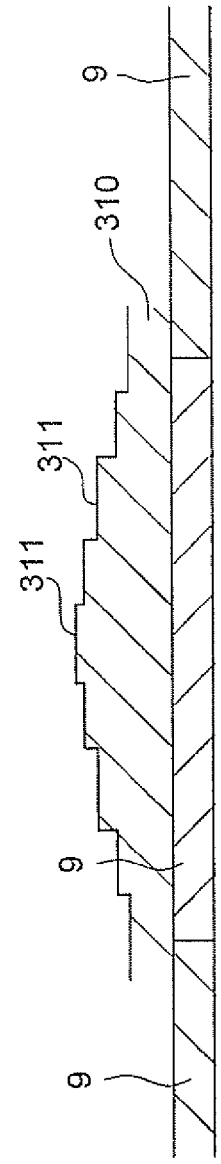
FIG. 2C is a cross sectional view of a CCD image pickup device according to a fourth embodiment of the present invention.

In a fourth embodiment of the invention shown in FIG. 2C, a diffusion-reflection layer 310 is a multi-stepped structure, in which the heights of the steps vary in the thickness direction. A series of stepped portions 311 are arranged from the boundaries of adjacent photodiodes 1 toward the center of the corresponding photodiode 1. The stepped portions 311 are highest (thickest) at the center of the photodiodes 1. The width and thickness (difference in height) of the stepped portions 311 can be optionally determined. The stepped portions 311 can be shaped so as to extend only in the longitudinal (vertical) or lateral (horizontal) direction, with respect to the light receiving surface and vary in thickness toward two sides. Alternatively, the stepped portions 311 can be in the form of a pyramid in which the thickness varies and decrease toward four sides of the photodiode 1.

Figure 2D:
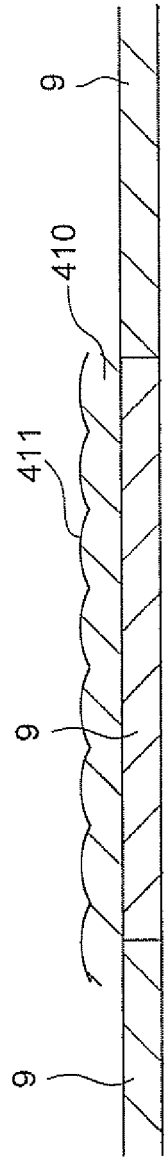
FIG. 2D is a cross sectional view of a CCD image pickup device according to a fifth embodiment of the present invention.

A diffusion-reflection layer 410 of the fifth embodiment of the invention shown in FIG. 2D is provided on the surface thereof with convex lens surfaces 411 so as to define a microstructure. The diameter of each convex lens surface 411 is smaller than the size of the photodiodes 1 in the longitudinal and lateral directions thereof. The convex lens surfaces 411 can be replaced with cylindrical lens surfaces extending in the vertical or horizontal direction or with those having a curvature in the vertical direction.

Figure 2E:
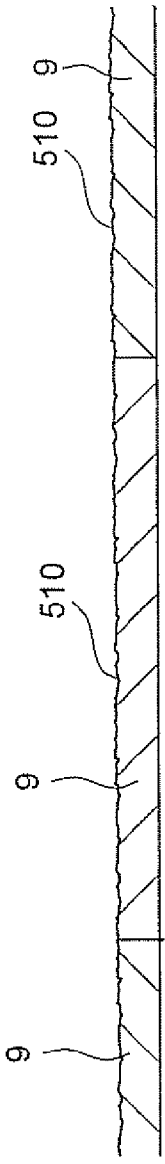
FIG. 2E is a cross sectional view of a CCD image pickup device according to a sixth embodiment of the present invention.

A diffusion-reflection layer 510 of the sixth embodiment of the invention shown in FIG. 2E is integrally formed on the color filters 9. The diffusion-reflection layer 510 includes fine depressions and projections, as a microstructure, formed on the surface of the color filters 9. With this arrangement, no increase in the number of the components occurs and the diffusion-reflection layer 510 can be formed in the-course of formation of the color filters 9, thus resulting in decrease in the number of the manufacturing processes.

According to the first through sixth embodiments, a part of the object light incident upon the image pickup device is diffused and reflected by the diffusion-reflection layer 7, 110, 210, 310, 410 or 510. Accordingly, when the image pickup device of the present invention is mounted in a single lens reflex camera, the amount of light incident upon the TTL light receiving element is increased and the TTL auto strobe characteristics can be improved.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. An image pickup device comprising:
   a plurality of photoelectric transducers;
   color filters provided on said plurality of photoelectric transducers; and
   a diffusion-reflection layer provided in front of said plurality of photoelectric transducers,
   said diffusion-reflection layer being configured such that a part of light incident on said diffusion-reflection layer is reflected and dispersed by said diffusion-reflection layer, and a remainder of said incident light is transmitted through said diffusion-reflection layer, the remainder of said incident light being incident on said plurality of photoelectric transducers,
   the image pickup device being configured such that, when mounted in a camera, an amount of the incident light on a TTL light receiving element of the camera is increased, and TTL auto strobe characteristics of the camera are improved
   wherein said diffusion-reflection layer comprises a transparent material provided on surfaces of said color filters.

* * * * *